United States Patent
Hsueh et al.

(10) Patent No.: US 9,530,200 B2
(45) Date of Patent: Dec. 27, 2016

(54) METHOD AND SYSTEM FOR INSPECTION OF A PATTERNED STRUCTURE

(71) Applicant: TAIWAN SEMICONDUCTOR MANUFACTURING CO., LTD., Hsinchu (TW)

(72) Inventors: Wen-Chang Hsueh, Longtan Township (TW); Chia-Jen Chen, Jhudong Township (TW); Hsin-Chang Lee, Zhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 238 days.

(21) Appl. No.: 14/309,980

(22) Filed: Jun. 20, 2014

(65) Prior Publication Data

US 2015/0371377 A1 Dec. 24, 2015

(51) Int. Cl.
*G06K 9/46* (2006.01)
*G06T 7/00* (2006.01)
*H01L 21/66* (2006.01)
*G02B 21/36* (2006.01)
*G02B 21/00* (2006.01)

(52) U.S. Cl.
CPC .......... *G06T 7/0006* (2013.01); *G02B 21/367* (2013.01); *G06T 7/0004* (2013.01); *G06T 7/0085* (2013.01); *H01L 22/12* (2013.01); *G02B 21/0016* (2013.01); *G06T 2207/10061* (2013.01); *G06T 2207/30148* (2013.01)

(58) Field of Classification Search
None
See application file for complete search history.

(56) References Cited

U.S. PATENT DOCUMENTS

| 6,272,236 B1* | 8/2001 | Pierrat | G01N 21/95607 382/144 |
| 8,064,681 B2* | 11/2011 | Okai | G06K 9/00 382/141 |
| 8,204,297 B1* | 6/2012 | Xiong | G01N 21/956 356/237.4 |
| 2008/0301624 A1* | 12/2008 | Heng | G06F 17/5068 716/55 |
| 2012/0145921 A1* | 6/2012 | Noji | G01R 31/307 250/442.11 |
| 2015/0146966 A1* | 5/2015 | Weisbuch | G06T 5/50 382/145 |

* cited by examiner

Primary Examiner — Brian P Werner
(74) Attorney, Agent, or Firm — Maschoff Brennan

(57) ABSTRACT

A method and a system for inspection of a patterned structure are provided. In various embodiments, the method for inspection of a patterned structure includes transferring the patterned structure into a microscope. The method further includes acquiring a top-view image of the patterned structure by the microscope. The method further includes transferring the patterned structure out of the microscope and exporting the top-view image to an image analysis processor. The method further includes measuring a difference between a contour of the top-view image and a predetermined layout of the patterned structure by the image analysis processor.

18 Claims, 6 Drawing Sheets

METHOD AND SYSTEM FOR INSPECTION OF A PATTERNED STRUCTURE

BACKGROUND

Technological advances in integrated circuit (IC) industry have produced generations of ICs has smaller sizes and more complex circuits than the previous generation. Therefore, an IC design process is required for planning various predetermined patterns in order to form complex circuits in a small size.

In the IC design process, a circuit designer uses a computer program to develop a logical description of the various components that are to be in a new circuit. The logical description is then converted into a description of the individual circuit building blocks performing the desired circuit functions. The description of the individual circuit building blocks is further converted into a layout file that specifies a predetermined pattern of a reticle for exposing a wafer during a photolithographic process in order to form various layers of the IC.

While fabricating the reticle for exposing the wafer, litho-etching and other process variations may occur such that the actually formed pattern of the reticle does not match the predetermined pattern designed in the IC design process. Consequently, formation of the layer of the IC would be severely impacted by utilizing the reticle with the mismatched pattern. Therefore, accurate inspection and measurement of a patterned structure such as the reticle is highly required to avoid utilizing the reticle with mismatched pattern when forming layers of the IC. Accordingly, improvements in methods and systems for inspection of a patterned structure continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
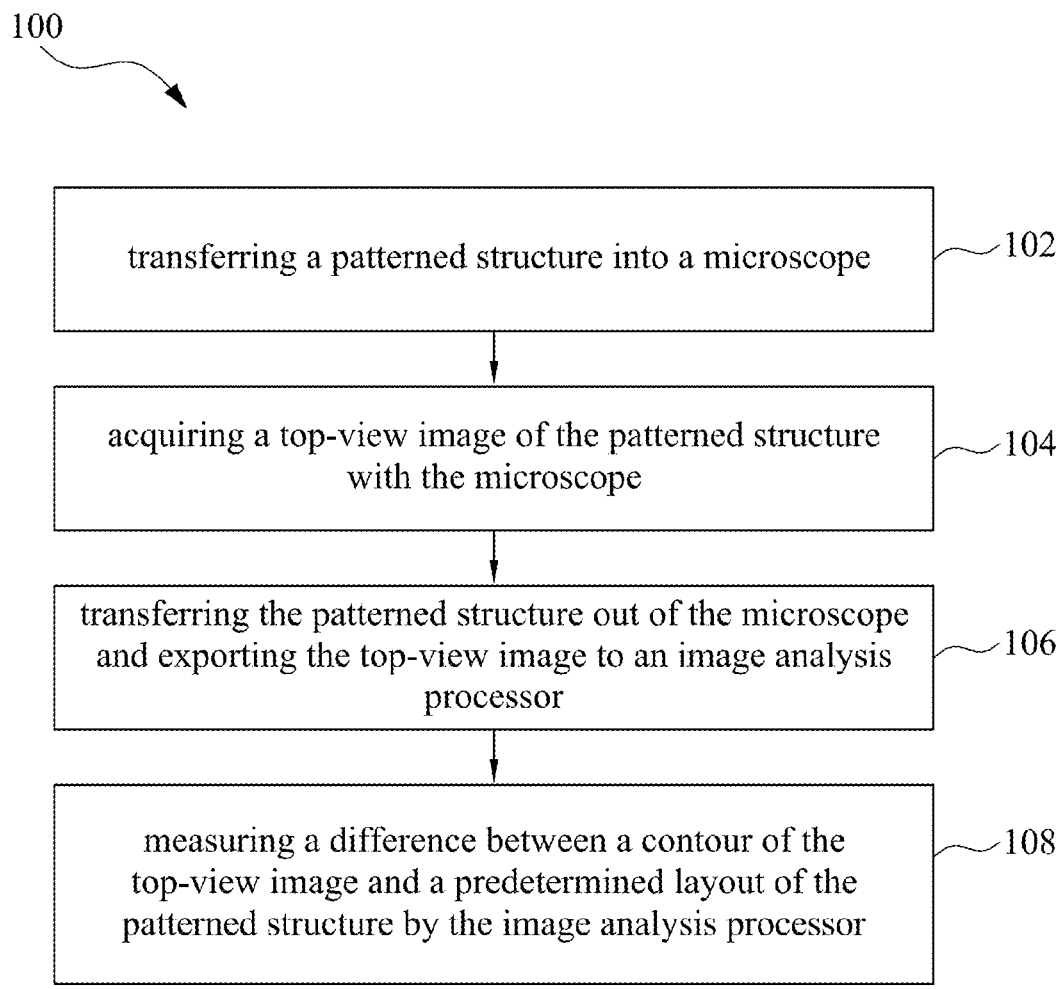
FIG. 1 is a flowchart illustrating a method for inspection of a patterned structure according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

As aforementioned, it is desirable to select and avoid utilizing the reticle with mismatched pattern when forming layers of the IC. Therefore, microscopes such as scanning electron microscope (SEM) are applied to inspect and measure the pattern fabricated on the reticle. However, only simple patterns of the patterned structure such as line width, spacing between the lines, or corner rounding could be measured by microscopes such as SEM. Complex patterns of the patterned structure with special shapes are still unable to be properly measured by microscopes. In addition, even measurement of these simple patterns of the patterned structure by the microscopes could be time consuming, and further suffers a throughput of a continuous flow in the reticle inspection processes. In this regard, methods and systems for inspection of a patterned structure are provided according to various embodiments of the present disclosure.

FIG. 1 is a flowchart illustrating a method for inspection of a patterned structure according to various embodiments of the present disclosure. The method 100 begins with block 102 in which a patterned structure is transferred into a microscope. The patterned structure could be a reticle or a semiconductor wafer. The microscope, for example, is a scanning electron microscope (SEM). The method 100 continues with block 104 in which a top-view image of the patterned structure is acquired by the microscope. The method 100 further including transferring the patterned structure out of the microscope and exporting the top-view image to an image analysis processor as shown in block 106. It should be noticed that the patterned structure is transferred out of the microscope after the top-view image of the patterned structure is acquired, and the top-view image of the patterned structure is exported to the image analysis processor for further analysis processes. The method 100 continues with block 108 in which a difference between a contour of the top-view image and a predetermined layout of the patterned structure is measured by the image analysis processor. The difference between the contour of the top-view image and the predetermined layout of the patterned structure is measured by the image analysis processor independent to the microscope. Therefore, not only simple patterns of the patterned structure such as lines, spaces, corner rounding could be measured, but also complex pattern of the patterned structure with special shapes could be also measured and inspected. In addition, since the patterned structure is transferring out of the microscope and the top-view image acquired by the microscope is exported to the image analysis processor to following measuring operations, the operation of acquiring the top-view image of the patterned structure and the operation of measuring the difference between the contour of the top-view image and the predetermined layout of the patterned structure are respectively performed by the microscope and the image analysis processor. In other words, in a continuous process for inspection of the patterned structures according to various embodiments of the present disclosure, the microscope only captures top-view image of the patterned structure without measuring, and the measuring is performed by the image analysis processor independent to the microscope. Therefore, the patterned structures could be inspected in continuous flow without being bottlenecked by the microscope. Accordingly, a throughput of inspection of the patterned structures according to various embodiments of the present disclosure could be significantly improved. The details of the methods 100 are described in following paragraphs.

Figure 2:
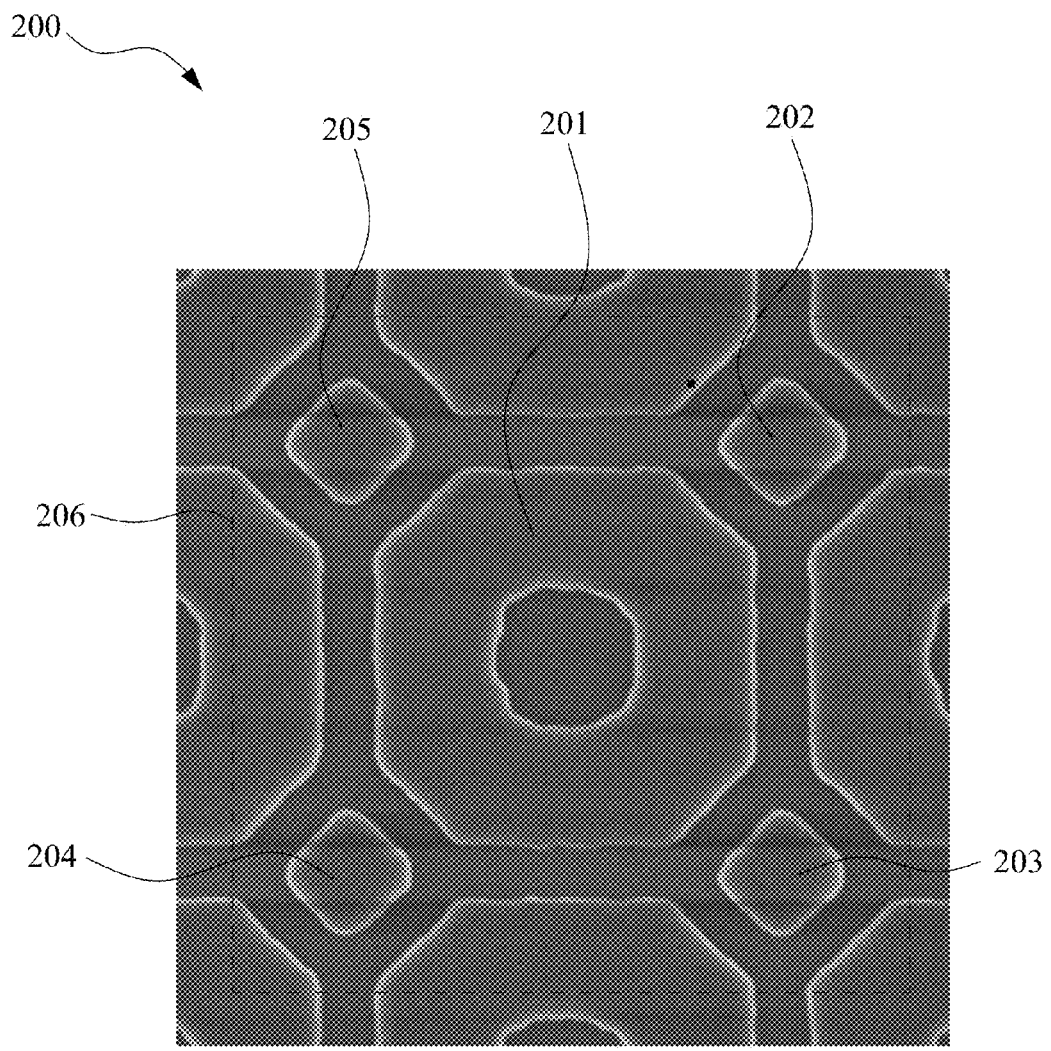
FIG. 2 is an exemplary top-view image of the patterned structure acquired by the microscope in an intermediate stage of the method for inspection of the patterned structure according to various embodiments of the present disclosure.

FIG. 2 is an exemplary top-view image 200 of the patterned structure acquired by the microscope in an intermediate stage of the method for inspection of the patterned structure according to various embodiments of the present disclosure. As aforementioned, after the operation of transferring the patterned structure into the microscope, a top-view image of the patterned structure is acquired by the microscope. In various embodiments of the present disclosure, the patterned structure is a reticle. The microscope could be a SEM. In the SEM, an electron beam emitted from an electron source is focused by a plurality of stages of lenses, and the patterned structure such as a reticle is scanned with the focused electron beam one or two dimensionally by a scanning deflector. The SEM could be mainly utilized for inspecting a reticle pattern used for a semiconductor exposing process. However, only simple patterns of the patterned structure such as straight lines, and spaces between the straight lines could be measured. As illustrated in FIG. 2, the exemplary top-view image 200 of the patterned structure includes special patterns. The shapes of these special patterns formed on the patterned structure, such as a reticle, could be also very important and crucial, and therefore inspections and measurements on these special patterns are necessary. For example, the top-view image 200 of the patterned structure including a donut pattern 201 and diamond patterns 202, 203, 204, and 205 are acquired as shown in FIG. 2. The top-view image 200 of the patterned structure including a donut pattern 201 and diamond patterns 202, 203, 204, and 205 is exported to an image analysis processor for following analysis while the patterned structure is transferred out of the microscope. In other words, the microscope only captures top-view image of the patterned structure without further measuring. The image analysis processor, which is independent to the microscope, performs the measuring. Therefore, the patterned structures could be inspected in continuous flow without being bottlenecked by the microscope. Accordingly, a throughput of inspection of the patterned structures according to various embodiments of the present disclosure could be significantly improved. The details of the operation of measuring are described in following paragraphs.

Figure 3:
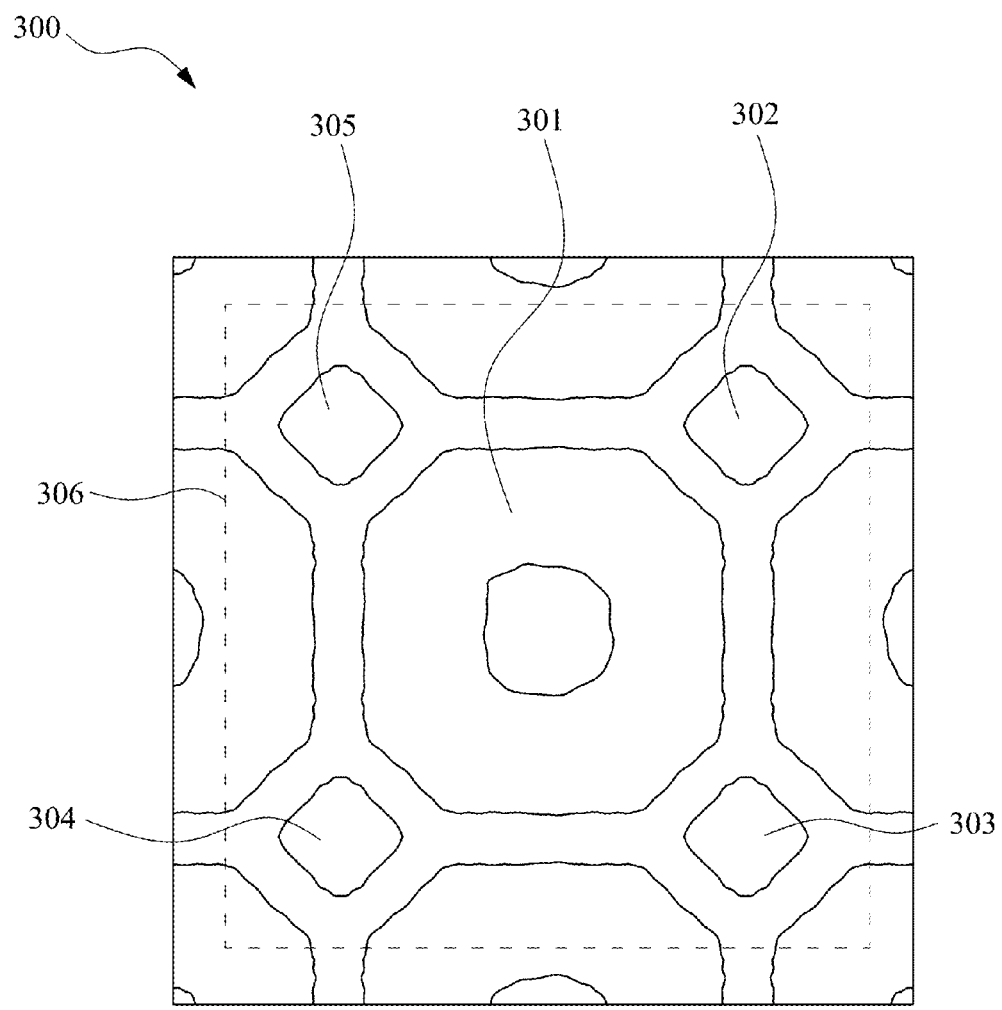
FIG. 3 is a contour of the exemplary top-view image of the patterned structure extracted by an image processor according to various embodiments of the present disclosure.
Figure 4:
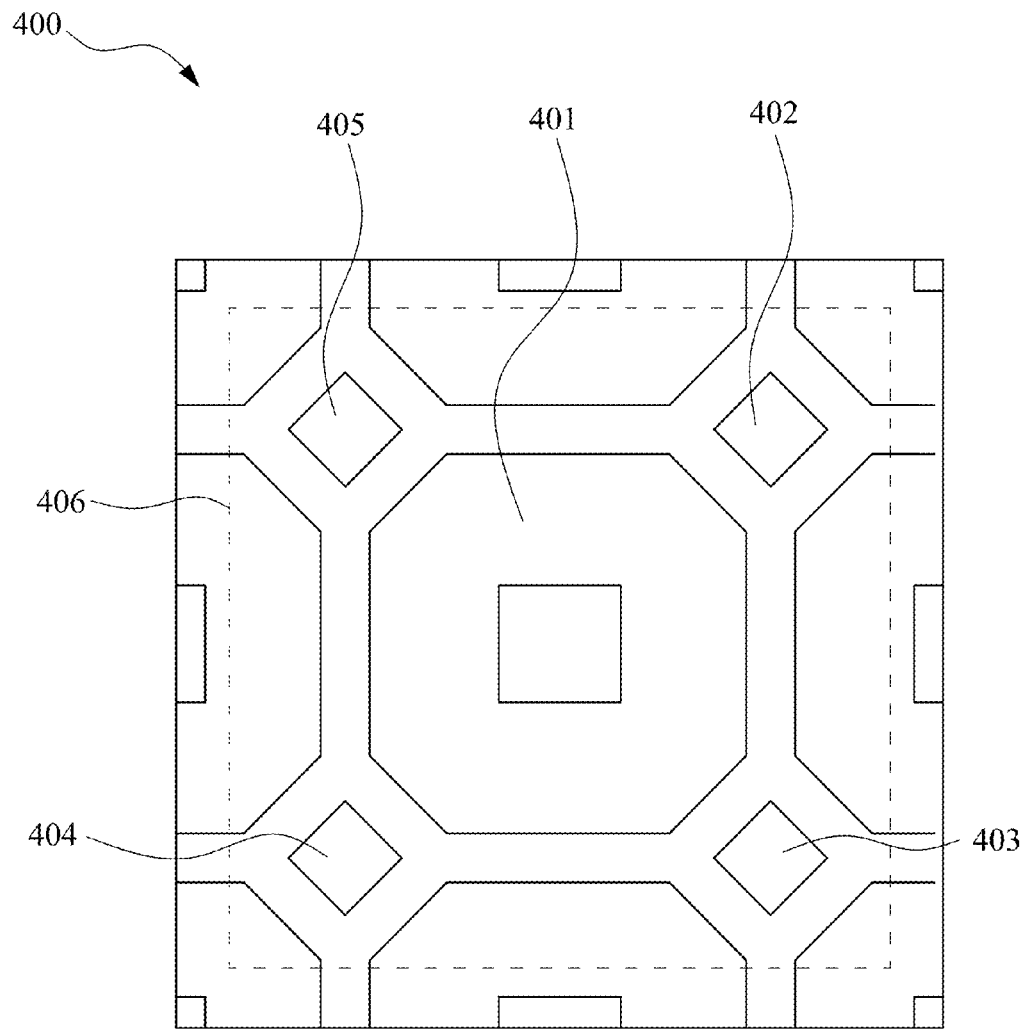
FIG. 4 is a predetermined layout of the patterned structure.
Figure 5:
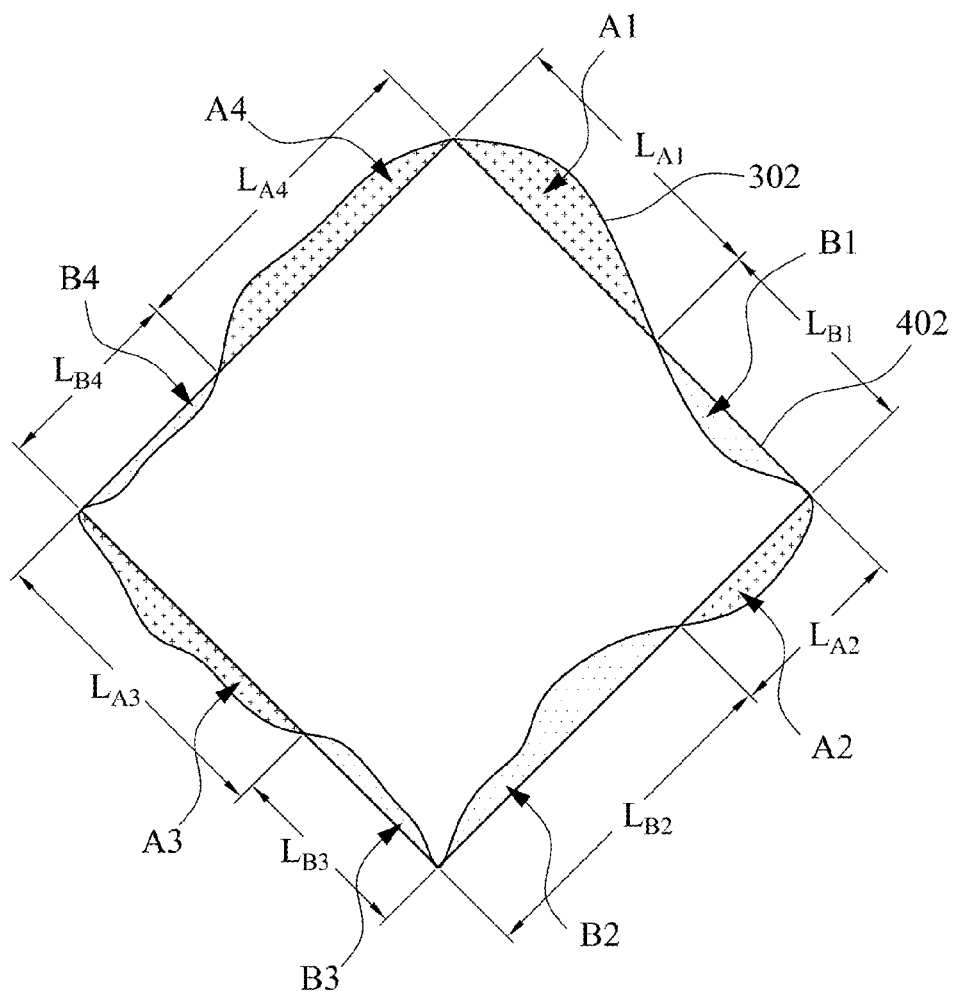
FIG. 5 is a schematic view of measuring a difference between a contour of the top-view image and a predetermined layout of the patterned structure by the image analysis processor.

FIG. 3 is a contour 300 of the exemplary top-view image 200 of the patterned structure extracted by the image processor according to various embodiments of the present disclosure. FIG. 4 is a predetermined layout 400 of the patterned structure. FIG. 5 is a schematic view of measuring a difference between a contour of the top-view image and the predetermined layout of the patterned structure by the image analysis processor. After the operation of transferring the patterned structure out of the microscope and exporting the top-view image 200 to the image analysis processor, a difference between a contour of the top-view image and a predetermined layout of the patterned structure by the image analysis processor. The image analysis processor could be composed of a computer or computers, which analyze and compute in parallel. The image analysis processor is independent to the microscope, and. The contour of the top-view image could be obtained in various ways such as extracting the contour from the top-view image by the image analysis processor. For example, a specific threshold contrast could be selected as a parameter of the edge line extracting process, and then the edge line extracted forms the contour of the top-view image. The predetermined layout of the patterned structure is a designed graphic data in fabricating the patterned structure. For example, the designed graphic data could be drawn by graphic software such GDS or OASIS systems. In various embodiments of the present disclosure, the operation of measuring the difference between the contour and the predetermined layout of the patterned structure by the image analysis processor, further comprises extracting the contour from the top-view image by the image analysis processor, receiving the predetermined layout of the patterned structure, and matching the contour and the predetermined layout of the patterned structure. As illustrated in FIG. 3, the contour 300 is extracted from the top-view image 200 (shown in FIG. 2) by the image analysis processor. The method for extracting the contour 300 from the exemplary top-view image 200 is, for example, an edge line extracting process performed by the image processor. The edge line extracting process could be performed by a computing apparatus of the image processor. As illustrated in FIG. 3, in the edge line extracting process, edge lines of the donut pattern 201 and diamond patterns 202, 203, 204, and 205 of the top-view image 200 (shown in FIG. 2) are extracted from white bands corresponding to the edge lines of the donut pattern 201 and diamond patterns 202, 203, 204, and 205 of the top-view image 200 (shown in FIG. 2) on the top-view image 200 acquired by the microscope such as SEM. As aforementioned, a specific threshold contrast could be selected as a parameter of the edge line extracting process such that the edge line extracted forms the contour of the top-view image. Optionally, parameters of the edge line extracting process could be fine-tuned to select different threshold contrasts and yield the contours extracted from different gradient of the top-view image 200. Therefore, a three dimensional contour could also be obtained by combining the contours extracted from different gradient of the top-view image 200. In other words, not only one specific threshold contrast could be selected as a parameter of the edge line extracting process, but also different threshold contrasts could be selected yield the contours extracted from different gradient of the top-view image 200 to yield the three dimensional contour of the top-view image 200.

As illustrate in FIG. 4, the predetermined layout 400 of the patterned structure is received. The predetermined layout 400 includes designed graphic data of the patterned structure such as a reticle (which could be simply referred to as a "mask") or a wafer used in a semiconductor manufacturing process. The predetermined layout 400 could be expressed in any forms. For example, the predetermined layout 400 could be drawn by graphic software such GDS or OASIS systems. In various embodiments of the present disclosure, the predetermined layout 400 of the patterned structure is in a GDS format or an OASIS format. The type of the designed graphic data is not particularly limited as long as the software for displaying the designed graphic data can display the data in the particular format and handle the designed graphic data as graphic data. The predetermined layout 400 could be stored in a storage medium of the image processor. However, the present disclosure is not limited to it. In other various embodiments of the present disclosure, the predetermined layout of the patterned structure is acquired from a contour of a top-view image of a standard patterned structure. For example, the predetermined layout of the patterned structure is acquired from the contour of the top-view image of the "golden reticle" which is the standard reticle as other reticle fabricated. The contour 300 (shown in FIG. 3) and the predetermined layout 400 of the patterned structure (shown in FIG. 4) is matched for measuring the difference between the contour 300 of the top-view image 200 and the predetermined layout 400 of the patterned structure by the image analysis processor. As aforementioned, the predetermined layout 400 of the patterned structure is a designed graphic data in fabricating the patterned structure, and could be drawn by graphic software such GDS or OASIS systems. In various embodiments of the present disclosure, before the operation of matching the contour 300 and the predetermined layout 400 of the patterned structure, the contour 300 from the top-view image is converted to the GDS format or the OASIS format. Therefore, the operation of matching the contour 300 and the predetermined layout 400 of the patterned structure could be performed more effectively since the contour 300 and the predetermined layout 400 of the patterned structure are in the same form. Besides, the predetermined layout 400 of the patterned structure could be further adjusted by stretching or shrinking in a certain value. For example, the value is determined according to a statistical process control (SPC) chart of statistical litho-etching process data. In other words, the predetermined layout 400 could be further adjusted according to actual litho-etching process data before matched with the contour 300. Therefore, the inevitable errors caused by litho-etching process during fabrication of the patterned structure could be further eliminated before the operation of matching the contour 300 and the predetermined layout 400 of the patterned structure. Accordingly, the operation of matching the contour 300 and the predetermined layout 400 of the patterned structure could be more precise and efficient. Furthermore, in various embodiments of the present disclosure, after the operation of matching the contour and the predetermined layout of the patterned structure, an area ratio of the contour to the predetermined layout of the patterned structure is calculated, and rounding correction features is added to the predetermined layout of the patterned structure in case that the area ratio of the contour to the predetermined layout of the patterned structure is not in a range of about 0.95 to about 1.05. Therefore, inspection for monitoring shape differences between the contour and the predetermined layout of the patterned structure, which is cause by process variation, could be performed more precisely. In various embodiments of the present disclosure, before matching the contour and the predetermined layout of the patterned structure, correction features is added to the predetermined layout of the patterned structure according to statistical litho-etching process data. In various embodiments of the present disclosure, the operation of extracting the contour from the top-view image by the image analysis processor includes extracting the contour from a unit of the top-view image, and wherein receiving the predetermined layout of the patterned structure includes receiving the predetermined layout corresponding to the unit. For example, as illustrated in FIG. 2 and FIG. 3, a contour 306 (including one donut pattern 301 and four diamond patterns 302, 303, 304, and 305) is extracted from a unit 206 of the top-view image 200, and the predetermined layout 406 is received corresponding to the unit 206. Therefore, the contour 306 extracted from the unit 206 and the predetermined layout 406 could be matched and compared. However, the present disclosure is not limited to it. In other various embodiments of the present disclosure, the operation of extracting the contour from the top-view image by the image analysis processor includes extracting and averaging contours form a plurality of units of the top-view image, and the operation of receiving the predetermined layout of the patterned structure includes receiving the predetermined layout corresponding to the unit. Therefore, the contour extracted from plurality of units of the top-view image and the predetermined layout could be matched and compared, and uniformity data within plurality of units of the top-view image could be obtained. In addition, in various embodiments of the present disclosure, the operation of measuring the difference between the contour and the predetermined layout of the patterned structure is only performed within a definable key region. For example, as illustrated in FIG. 5, a user could define the diamond pattern 302 as the definable key region, and the operation of measuring the difference between the contour and the predetermined layout of the patterned structure is only performed within the diamond pattern 302. Therefore, efficiency and throughput of the operation of measuring the difference between the contour and the predetermined layout of the patterned structure could be further enhanced since only a restricted region, the diamond pattern 302, is measured. As illustrated in FIG. 5, the difference between the contour (the diamond pattern 302) and the predetermined layout (the predetermined layout 402 corresponding to the diamond pattern) of the patterned structure could expressed as excess areas A1, A2, A3 and A4, lacking areas B1, B2, B3, and B4, and lengths $L_{A1}$, $L_{A2}$, $L_{A3}$, $L_{A4}$, $L_{B1}$, $L_{B2}$, $L_{B3}$, and $L_{B4}$ respectively corresponded to those areas. The excess areas A1, A2, A3 and A4 indicate areas of the contour more than those of the predetermined layout, and lacking areas B1, B2, B3, and B4 indicate areas of the contour less than those of the predetermined layout. The excess areas A1, A2, A3 and A4, lacking areas B1, B2, B3, and B4, and lengths $L_{A1}$, $L_{A2}$, $L_{A3}$, $L_{A4}$, $L_{B1}$, $L_{B2}$, $L_{B3}$, and $L_{B4}$ could be obtained by analyzing processes performed by the image analysis processor. The difference between the contour and the predetermined layout could be expressed as three indexes including ID1, ID2 and ID3. The value of ID1 is $(A1+A2+A3+A4)/(L_{A1}+L_{A2}+L_{A3}+L_{A4})$. The value of ID2 is $(B1+B2+B3+B4)/(L_{B1}+L_{B2}+L_{B3}+L_{B4})$. The value of ID3 is $[(A1+A2+A3+A4)-(B1+B2+B3+B4)]/[(L_{A1}+L_{A2}+L_{A3}+L_{A4}+L_{B1}+L_{B2}+L_{B3}+L_{B4})$. For example, when the ID1, ID2 and ID3 between the contour extracted form the top-view of the patterned structure and the predetermined layout are respectively less than 3 nm, 3 nm, and 2 nm, the patterned structure could be regarded as being well fabricated. Otherwise, the patterned structure is regarded as failed and would be scraped without utilizing as a reticle. However, the present disclosure is not limited thereto. The value of three indexes including ID1, ID2 and ID3 could be well adjusted according to different requirements. However, the present disclosure is not limited thereto. The difference between the contour and the predetermined layout could be also expressed as other indexes if necessary.

Figure 6:
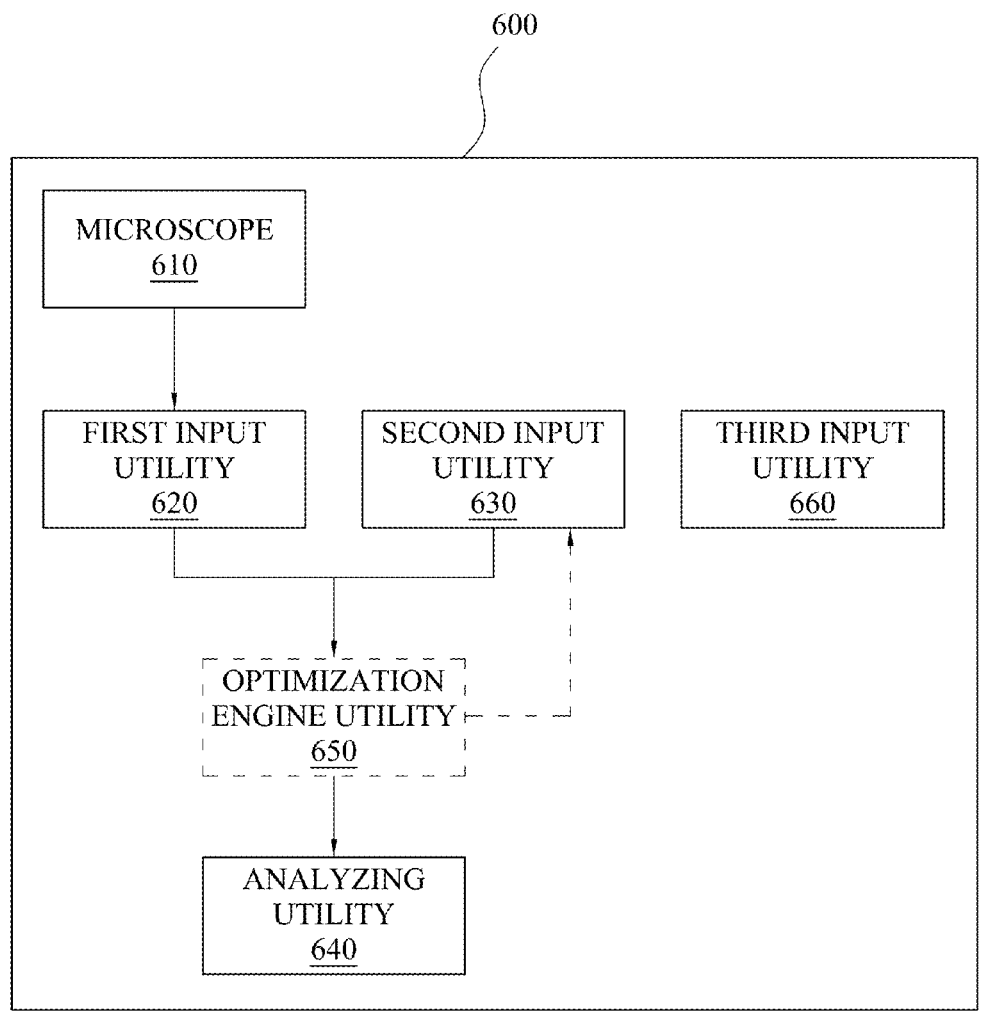
FIG. 6 is a schematic view of a system for inspection of a patterned structure according to various embodiments of the present disclosure.

FIG. 6 is a schematic view of a system for inspection of a patterned structure according to various embodiments of the present disclosure. As illustrated in FIG. 6, the system 600 includes a microscope 610, a first input utility 620, a second input utility 630, and an analyzing utility 640. The microscope 610 is configured for acquiring top-view images (as illustrated in FIG. 2) of units of the patterned structure. In various embodiments of the present disclosure, the microscope 610 is a SEM. The first input utility 620 is configured for receiving the top-view images acquired by the microscope 640, and averaging the top-view images of units of the patterned structure to extract a contour. The second input utility 630 is configured for receiving a predetermined layout of the patterned structure. In various embodiments of the present disclosure, the predetermined layout of the patterned structure is a top-view image of a standard patterned structure. For example, the predetermined layout of the patterned structure is acquired from the contour of the top-view image of the "golden reticle" which is the standard patterned structure as other reticle fabricated. In various embodiments of the present disclosure, the predetermined layout of the patterned structure is in a GDS format or an OASIS format. In various embodiments of the present disclosure, the first input utility 620 is further configured for converting the contour from the top-view image to a GDS format or an OASIS format. Therefore, it is more effective for matching the contour and the predetermined layout of the patterned structure. In various embodiments of the present disclosure, the second input utility 630 is further configured for adding correction features to the predetermined layout of the patterned structure according to statistical litho-etching process data. The analyzing utility 640 is configured for matching the contour and the predetermined layout of the patterned structure, measuring a difference between the contour and the predetermined layout of the patterned structure, and outputting the difference between the contour and the predetermined layout of the patterned structure. It should be noticed that the difference between the contour of the top-view image and the predetermined layout of the patterned structure is measured by the analyzing utility 640 independent to the microscope 610. Therefore, not only simple patterns of the patterned structure such as lines, spaces, corner rounding could be measured, but also complex pattern of the patterned structure with special shapes could be also measured and inspected.

As illustrated in FIG. 6, in various embodiments of the present disclosure, the system 600 further includes an optimization engine utility 650. The optimization engine utility 650 is configured for calculating an area ratio of the contour to the predetermined layout of the patterned structure, and adding rounding correction features to the predetermined layout of the patterned structure in case that the area ratio of the contour to the predetermined layout of the patterned structure is not in a range of about 0.95 to about 1.05. Therefore, inspection for monitoring shape differences between the contour and the predetermined layout of the patterned structure, which is cause by process variation, could be performed more precisely. In various embodiments of the present disclosure, the system 600 further includes a third input utility 660 configured for defining a key region for the analyzing unity 640. Therefore, efficiency and throughput of measuring the difference between the contour and the predetermined layout of the patterned structure could be further enhanced since only a restricted region is measured.

According to various embodiments of the present disclosure, a reliable method and a reliable system for inspection of a patterned structure are provided. Not only simple patterns of the patterned structure could be measured, but also complex pattern of the patterned structure with special shapes could be also measured and inspected. Since the patterned structure is transferring out of the microscope and the top-view image acquired by the microscope is exported to the image analysis processor to following measuring operations, the operation of acquiring the top-view image of the patterned structure and the operation of measuring the difference between the contour of the top-view image and the predetermined layout of the patterned structure are respectively performed by the microscope and the image analysis processor. In other words, in a continuous process for inspection of the patterned structures according to various embodiments of the present disclosure, the microscope only captures top-view image of the patterned structure without measuring, and the measuring is performed by the image analysis processor independent to the microscope. Therefore, the patterned structures could be inspected in continuous flow without being bottlenecked by the microscope. Accordingly, a throughput of inspection of the patterned structures according to various embodiments of the present disclosure could be significantly improved. Furthermore, a key definable region of the patterned structure could be defined according to various requirements to yield clear information regarding process ability and further enhance measurement efficiency.

According to various embodiments of the present disclosure, a method for inspection of a patterned structure includes transferring the patterned structure into a microscope. The method further includes acquiring a top-view image of the patterned structure by the microscope. The method further includes transferring the patterned structure out of the microscope and exporting the top-view image to an image analysis processor. The method further includes measuring a difference between a contour of the top-view image and a predetermined layout of the patterned structure by the image analysis processor.

According to various embodiments of the present disclosure, a system for inspection of a patterned structure includes a microscope, a first input utility, a second input utility, and an analyzing utility. The microscope is configured for acquiring top-view images of units of the patterned structure. The first input utility is configured for receiving the top-view images acquired by the microscope, and averaging the top-view images of units of the patterned structure to extract a contour. The second input utility is configured for receiving a predetermined layout of the patterned structure. The analyzing utility is configured for matching the contour and the predetermined layout of the patterned structure, measuring a difference between the contour and the predetermined layout of the patterned structure, and outputting the difference between the contour and the predetermined layout of the patterned structure.

According to various embodiments of the present disclosure, a system for inspection of a patterned structure includes a microscope, a first input utility, a second input utility, an analyzing utility, a third input utility, and an optimization engine utility. The microscope is configured for acquiring top-view images of units of the patterned structure. The first input utility is configured for receiving the top-view images acquired by the microscope, and averaging the top-view images of units of the patterned structure to extract a contour. The second input utility is configured for receiving a predetermined layout of the patterned structure. The analyzing utility is configured for matching the contour and the predetermined layout of the patterned structure, measuring a difference between the contour and the predetermined layout of the patterned structure, and outputting the difference between the contour and the predetermined layout of the patterned structure. The third input utility is configured for defining a key region for the analyzing unity to matching the contour and the predetermined layout of the patterned structure, measuring a difference between the contour and the predetermined layout of the patterned structure. The optimization engine utility is configured for calculating an area ratio of the contour to the predetermined layout of the patterned structure, and adding rounding correction features to the predetermined layout of the patterned structure in case that the area ratio of the contour to the predetermined layout of the patterned structure is not in a range of about 0.95 to about 1.05.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   transferring a patterned structure into a microscope;
   acquiring a top-view image of the patterned structure by the microscope;
   transferring the patterned structure out of the microscope and exporting the top-view image to an image analysis processor;
   measuring a difference between a contour of the top-view image and a predetermined layout of the patterned structure by the image analysis processor;
   calculating an area ratio of the contour to the predetermined layout of the patterned structure; and
   adding rounding correction features to the predetermined layout of the patterned structure such that the area ratio of the contour to the predetermined layout of the patterned structure is not in a range of 0.95 to 1.05.

2. The method of claim 1, wherein measuring the difference between the contour and the predetermined layout of the patterned structure by the image analysis processor, further comprises:
   extracting the contour from the top-view image by the image analysis processor;
   receiving the predetermined layout of the patterned structure; and
   matching the contour and the predetermined layout of the patterned structure.

3. The method of claim 2, wherein the predetermined layout of the patterned structure is in a GDS format or an OASIS format.

4. The method of claim 3, before matching the contour and the predetermined layout of the patterned structure, further comprising:
   converting the contour from the top-view image to a GDS format or an OASIS format.

5. The method of claim 2, wherein extracting the contour from the top-view image by the image analysis processor comprises extracting the contour from a unit of the top-view image, and wherein receiving the predetermined layout of the patterned structure comprises receiving the predetermined layout corresponding to the unit.

6. The method of claim 2, wherein extracting the contour from the top-view image by the image analysis processor comprises extracting and averaging contours form a plurality of units of the top-view image, and wherein receiving the predetermined layout of the patterned structure comprises receiving the predetermined layout corresponding to the unit.

7. The method of claim 2, before matching the contour and the predetermined layout of the patterned structure, further comprising:
   adding correction features to the predetermined layout of the patterned structure according to statistical litho-etching process data.

8. The method of claim 1, wherein measuring the difference between the contour and the predetermined layout of the patterned structure is only performed within a definable key region.

9. The method of claim 1, wherein the predetermined layout of the patterned structure is acquired from a contour of a top-view image of a standard patterned structure.

10. The method of claim 1, wherein the patterned structure is a reticle.

11. A system, comprising:
    a microscope configured for acquiring top-view images of units of a patterned structure;
    a first input utility configured for receiving the top-view images acquired by the microscope, and averaging the top-view images of units of the patterned structure to extract a contour;
    a second input utility configured for receiving a predetermined layout of the patterned structure;
    an analyzing utility configured for matching the contour and the predetermined layout of the patterned structure, measuring a difference between the contour and the predetermined layout of the patterned structure, and outputting the difference between the contour and the predetermined layout of the patterned structure; and
    an optimization engine utility configured for calculating an area ratio of the contour to the predetermined layout of the patterned structure, and adding rounding correction features to the predetermined layout of the patterned structure in case that the area ratio of the contour to the predetermined layout of the patterned structure is not in a range of 0.95 to 1.05.

12. The system of claim 11, further comprising:
    a third input utility configured for defining a key region for the analyzing utility to matching the contour and the predetermined layout of the patterned structure, measuring a difference between the contour and the predetermined layout of the patterned structure.

13. The system of claim 11, wherein the predetermined layout of the patterned structure is a top-view image of a standard patterned structure.

14. The system of claim 11, wherein the predetermined layout of the patterned structure is in a GDS format or an OASIS format.

15. The system of claim 14, wherein the first input utility is further configured for converting the contour from the top-view images to a GDS format or an OASIS format.

16. The system of claim 11, wherein the second input utility is further configured for adding correction features to the predetermined layout of the patterned structure according to statistical litho-etching process data.

17. A system, comprising:
- a microscope configured for acquiring top-view images of a patterned structure;
- a first input utility configured for receiving the top-view images acquired by the microscope, and averaging the top-view images of units of the patterned structure to extract a contour;
- a second input utility configured for receiving a predetermined layout of the patterned structure;
- an analyzing utility configured for matching the contour and the predetermined layout of the patterned structure, measuring a difference between the contour and the predetermined layout of the patterned structure, and outputting the difference between the contour and the predetermined layout of the patterned structure;
- a third input utility configured for defining a key region for the analyzing utility to matching the contour and the predetermined layout of the patterned structure, measuring a difference between the contour and the predetermined layout of the patterned structure; and
- an optimization engine utility configured for calculating an area ratio of the contour to the predetermined layout of the patterned structure, and adding rounding correction features to the predetermined layout of the patterned structure in case that the area ratio of the contour to the predetermined layout of the patterned structure is not in a range of 0.95 to 1.05.

18. The system of claim 17, wherein the predetermined layout of the patterned structure is in a GDS format or an OASIS format, and the first input utility is further configured for converting the contour from the top-view images to a GDS format or an OASIS format.

* * * * *